US 7,064,585 B2

(12) United States Patent
Glass

(10) Patent No.: US 7,064,585 B2
(45) Date of Patent: Jun. 20, 2006

(54) DETECTING PEAK SIGNALS

(75) Inventor: Kevin W. Glass, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 35 days.

(21) Appl. No.: 10/748,462

(22) Filed: Dec. 30, 2003

(65) Prior Publication Data

US 2005/0140396 A1  Jun. 30, 2005

(51) Int. Cl.
*H03K 5/153* (2006.01)
(52) U.S. Cl. .......................... 327/58; 327/354
(58) Field of Classification Search ............ 327/58–64, 327/343, 354
See application file for complete search history.

(56) References Cited

U.S. PATENT DOCUMENTS

| 4,240,015 | A | * | 12/1980 | White | 388/806 |
|---|---|---|---|---|---|
| 4,362,999 | A | * | 12/1982 | Sauer | 329/346 |
| 4,571,507 | A | * | 2/1986 | Collings | 327/74 |
| 5,189,589 | A | * | 2/1993 | Marschall | 361/93.2 |
| 5,923,590 | A | * | 7/1999 | Yero | 365/189.01 |
| 6,008,673 | A | | 12/1999 | Glass et al. | 327/77 |
| 6,525,608 | B1 | | 2/2003 | Krupnik | 330/253 |
| 6,552,605 | B1 | | 4/2003 | Yoon | 330/9 |
| 6,593,810 | B1 | | 7/2003 | Yoon | 330/69 |
| 6,665,398 | B1 | * | 12/2003 | Ludeman | 379/399.01 |
| 6,678,478 | B1 | * | 1/2004 | Ono et al. | 398/141 |

OTHER PUBLICATIONS

GiGA LXT19908 10 Gbit/s Limiting Amplifier Device Product Brief. GiGA an Intel company. Feb. 2001.
GiGA an Intel Company 2.5 Gbit/s Limiting Ampliphier GD16511, Data Sheet Rev.: 5; Jul. 24, 2001.

* cited by examiner

*Primary Examiner*—Kenneth B. Wells
(74) *Attorney, Agent, or Firm*—Trop, Pruner & Hu, P.C.

(57) ABSTRACT

In one embodiment, the present invention includes an apparatus having a threshold detector with a current comparator to determine if an input signal exceeds a threshold. The input signal may be obtained from a received optical signal and may be compared to a reference signal obtained from a hierarchical Schmitt trigger, in certain embodiments.

25 Claims, 6 Drawing Sheets

DETECTING PEAK SIGNALS

BACKGROUND

The present invention relates generally to detecting peak signals, and more particularly to detecting such signals at high frequencies.

The operating frequencies of communication systems continue to rise, and engineering components for such communication systems raises a number of challenges. For example, many communication systems include one or more amplifiers to amplify a received signal. At very high bandwidths, for example, optical communication systems operating at frequencies greater than 10 Gigahertz (GHz) and above, various problems may arise. Such problems include the possibility of bandwidth degradation, power dissipation, and increased die area. More so, for a circuit in an amplifier to detect a loss of received signal over large bandwidths, an extremely large requirement on the dynamic range of such detection is needed. Such a loss of detection circuit also requires low loading so that it causes no degradation in an amplifier's bandwidth or gain.

Additionally, in such communication systems, a need exists to vary a threshold signal representative of a loss of signal threshold, as hysteresis is needed to differentiate between an assertion level and a deassertion level. Further, such a threshold level must be maintained over a wide range (i.e., as measured in decibels) and further must be maintained over varying process, temperature, and supply voltage conditions.

A need thus exists to detect peak signals and to vary threshold levels over a wide operating range.

DETAILED DESCRIPTION

In various embodiments, a circuit implementing a highly sensitive, minimum complexity, comparator/peak detector circuit (i.e., a threshold detector) may provide very high frequency of operation, high dynamic range, very low input loading, and self-latching. As used herein the term "high frequency" means a frequency greater than approximately 10 GHz.

In certain embodiments, such a circuit may be used to detect a loss of received signal in a communication system. For example, in an optical communication system, an amplifier, such as a limiting amplifier (LIA), may be present to amplify a received optical signal (after its conversion to an electrical signal). Such a limiting amplifier may have a plurality of differential stages to boost the received signal. Because its loading is so low, the threshold detector may be inserted after a second differential amplifier stage of the limiting amplifier, while causing no degradation in the limiting amplifier bandwidth or gain.

In one embodiment, a threshold detector may be incorporated into a limiting amplifier having a 40 GHz bandwidth. For such high frequency operation, the threshold detector may have a loss of signal detection range from approximately 15 millivolts (mV) to 150 mV. In other embodiments, the detection range may vary accordingly. To aid in detection, the circuit may measure the absolute value, or peak voltage, of the limiting amplifier differential stage output, rather than the differential value.

Figure 1:
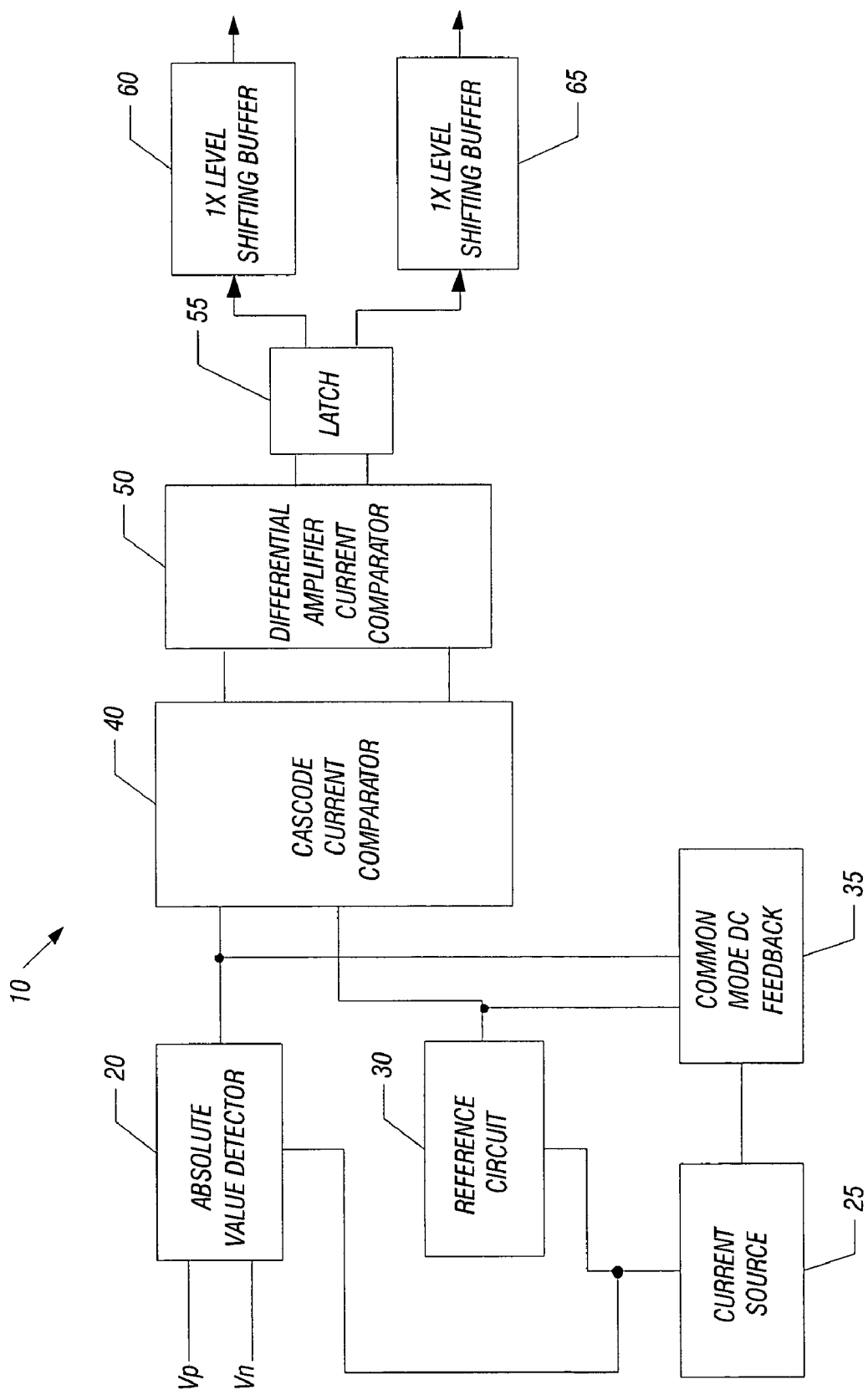
FIG. 1 is a block diagram of a threshold detector in accordance with one embodiment of the present invention.

Referring now to FIG. 1, shown is a block diagram of a threshold detection circuit in accordance with one embodiment of the present invention. As shown in FIG. 1, threshold detector 10 receives a differential pair of voltage signals $V_p$ and $V_n$ at an absolute value detector 20. In one embodiment, input voltage signals may be obtained from a differential stage of a LIA, a transimpedance amplifier (TIA) output or the like, in an embodiment used in an optical communication system. A current source 25 may be used to provide a current source to both absolute value detector 20 and a reference circuit 30.

In one embodiment, reference circuit 30 may generate reference signals that are compensated for temperature and current flowing through the circuit such that the output of reference circuit 30 provides a tracking reference signal. Use of this reference signal allows a valid threshold comparison to be performed over wide frequency ranges and temperature conditions. In one embodiment, reference circuit 30 may include a plurality of Schmitt triggers as will be discussed below.

The outputs of absolute value detector 20 and reference circuit 30 may be provided to a low impedance or cascode comparator 40. Also, these output signals may be fed to a common mode direct current (DC) feedback circuit 35, which provides feedback to current source 25. In one embodiment, feedback circuit 35 may be the same bias generator as used in an internal stage of a limiting amplifier of which threshold detector 10 is a part. In such manner, the DC output level of the current comparator 40 may be maintained such that the transistors operate in the forward active region.

Cascode current comparator 40 may be used to perform desired threshold detection by comparing the output of absolute value detector 20 to the tracking reference signal provided by reference circuit 30. Differential outputs of cascode current comparator 40 may be provided to a differential amplifier current comparator 50 that may be used to generate a high gain output signal that is input to a latch 55, which may be a set/reset latch. The outputs of latch 55 may be provided to one times (1×) level shifting buffers 60 and 65, respectively. In one embodiment, such level shifting buffers each may be formed of a Darlington circuit.

The output of buffers 60 and 65 may be a differential signal representing a loss of received signal of an input signal represented by differential signal pair $V_p$ and $V_n$.

For example, the loss of received signal may be indicative that an optical receiver has lost an incoming signal. In such manner, an optical communication system including a limiting amplifier having such a threshold detector may generate a loss of received signal that may be transmitted back to a transmitting source so that lost data may be retransmitted via an optical fiber, for example.

Figure 2:
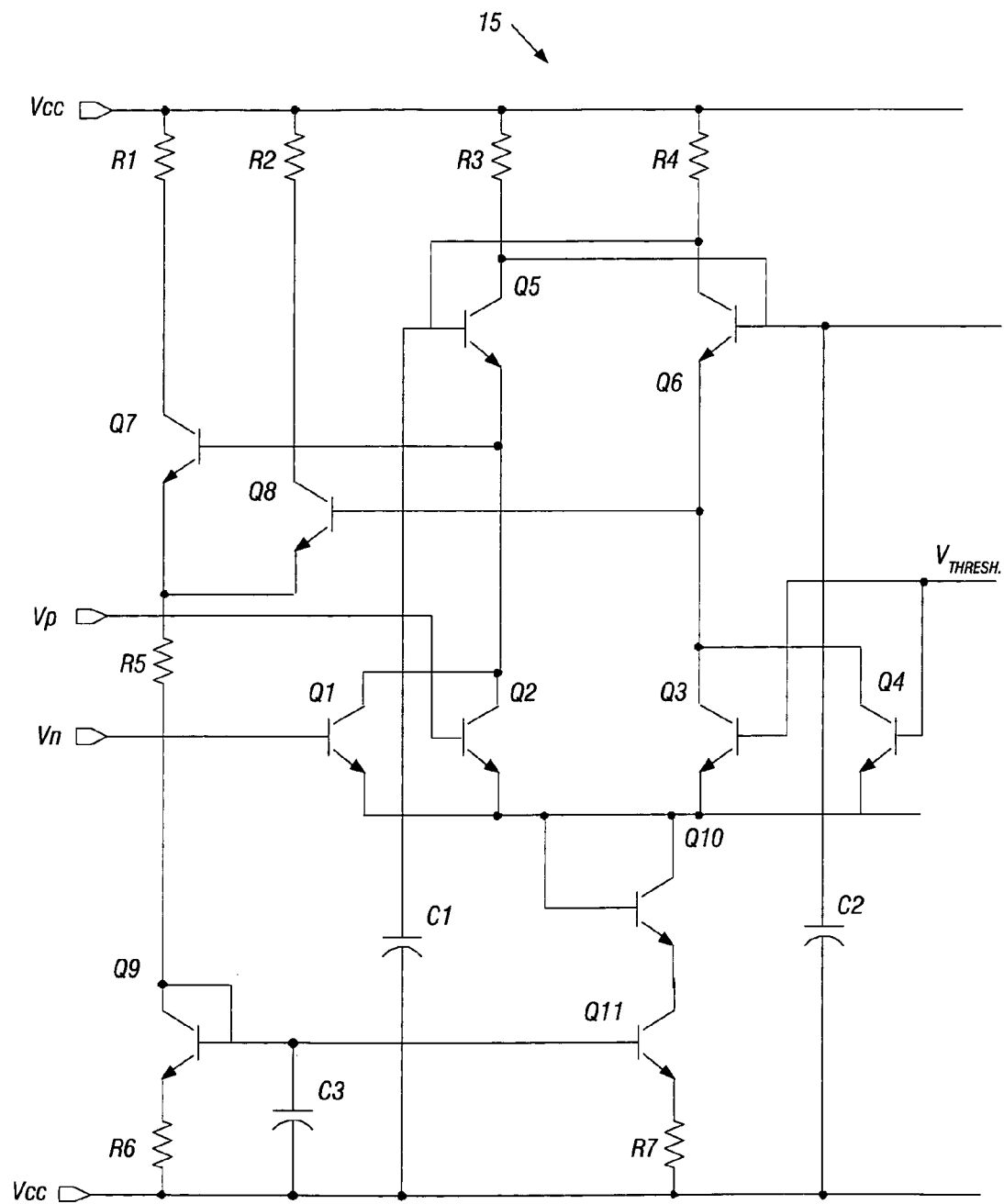
FIG. 2 is a schematic diagram of a portion of a threshold detector in accordance with one embodiment of the present invention.

Referring now to FIG. 2, shown is a schematic diagram of a portion of a threshold detector 15 in accordance with one embodiment of the present invention. As shown in FIG. 2, differential input signals $V_p$ and $V_n$ are coupled to, respectively, a base of transistors Q1 and Q2. In the embodiment shown in FIG. 2, transistors Q1 and Q2 (and the additional transistors of FIG. 2) are n-p-n Indium Phosphide (InP) heterojunction bipolar transistors (hbt). Such transistors may be minimum sized, and have a beta ($\beta$) of approximately 20. Transistors Q1 and Q2 have collectors and emitters coupled together, as shown in FIG. 2. Transistors Q1 and Q2 thus form an input stage for threshold detector 15.

As further shown in FIG. 2, transistors Q3 and Q4 have emitters coupled together with the emitters of transistors Q1 and Q2. Additionally, the bases of transistors Q3 and Q4 are coupled together, as are their collectors. The bases of transistors Q3 and Q4 are coupled to receive a tracking reference signal, $V_{threshold}$. In one embodiment, the tracking reference may be obtained from a plurality of Schmitt triggers, as will be discussed below.

Further shown in FIG. 2, transistors Q5 and Q6 act as a current comparator to compare the input signal to the reference signal. As shown in FIG. 2, Q5 and Q6 have collectors coupled to the bases of each other. Further, transistor Q5 has an emitter coupled to the collectors of Q1 and Q2 and Q6 has an emitter coupled to the collectors of Q3 and Q4.

A power supply voltage ($V_{CC}$) is coupled to various transistors through resistors R1 through R4, respectively. Resistors R1 through R4 may have values that vary in different embodiments. Transistor Q7 has a base coupled to the emitter of Q5, a collector coupled to the power supply voltage through R1 and an emitter coupled to the emitter of transistor Q8. Transistor Q8 in turn has a base tied to the emitter of Q6 and a collector coupled to the power supply voltage via R2. Transistor Q9 has a collector coupled to the emitter of Q7 through resistor R5 and a collector coupled through resistor R6 to $V_{CC}$. More so, transistor Q9 has its base coupled to its collector, which is also coupled to a base of transistor Q11, which is connected in series with transistor Q10 and resistor R7. Capacitors C1, C2 and C3 are also included in the threshold detector 15 for biasing and noise reduction purposes.

Thus as shown in FIG. 2, a differential amplifier stage may have its current set by a common mode feedback bias generator and a compare reference utilizing the same bias generator as the limiting amplifier internal stages. The input to the circuit on one side are transistors Q1 and Q2, which may be minimum size n-p-n transistors from each output of the internal differential limiting amplifier stage, and may be coupled to form an absolute value rectifier, or peak detector circuit.

In the embodiment of FIG. 2, the reference side of the comparator may be connected to a voltage reference that is a replica of half of the differential limiting amplifier stage that is supplying the input signals, along with utilizing the same bias generator as the rest of the limiting amplifier. In such an embodiment, emitter area may be maintained on both sides of the comparator, providing extremely good process, temperature, and power supply level tracking.

High frequency of operation and low input loading may be obtained by using cross coupled minimum size n-p-n transistors Q5 and Q6 between the input transistors and the resistor loads. These transistors present a low input impedance at the collector of the input devices Q1 and Q2, minimizing the Miller effect multiplication of the base—collector capacitance of these devices, thus minimizing the input loading to the comparator, along with maximizing the frequency of operation of the comparator. The cross coupled devices may provide positive feed-back gain to the comparator, along with providing a built-in latch. Further, a separate bias voltage is not needed for these devices.

Thus, a large dynamic operating range may be achieved using a minimal number of devices between the input transistors and the power supply, along with a common mode feedback circuit that maintains operation of these devices in the forward active region over all input levels, power supply levels, process corners and temperature. Due to the minimal design implementation, power is saved, while enabling a very compact microwave friendly layout.

A means of varying the loss of signal threshold may be used to create hysteresis between an assertion threshold level for a loss of signal detect and a de-assertion threshold level. In certain embodiments, the ratio between these levels may be maintained to a range of approximately 2 decibels (dB) to 6 dB, over a wide range of process, temperature, and supply voltage conditions. To maintain the loss of signal hysteresis ratio of 2 dB to 6 dB, it may be desirable to vary the amount of hysteresis voltage introduced in direct proportion to the threshold level set.

In one embodiment, a Schmitt trigger coupled inside a Schmitt trigger circuit, i.e., a hierarchical Schmitt trigger may be used to obtain a variable hysteresis level. This circuit may vary its magnitude of hysteresis voltage imposed by the first level Schmitt trigger in direct proportion to an externally programmed threshold voltage level for the first level Schmitt trigger. In various embodiments, this hierarchy may be continuously extended to n levels. The Schmitt triggers may be implemented with differential amplifiers having one output feeding back into one input.

Figure 3:
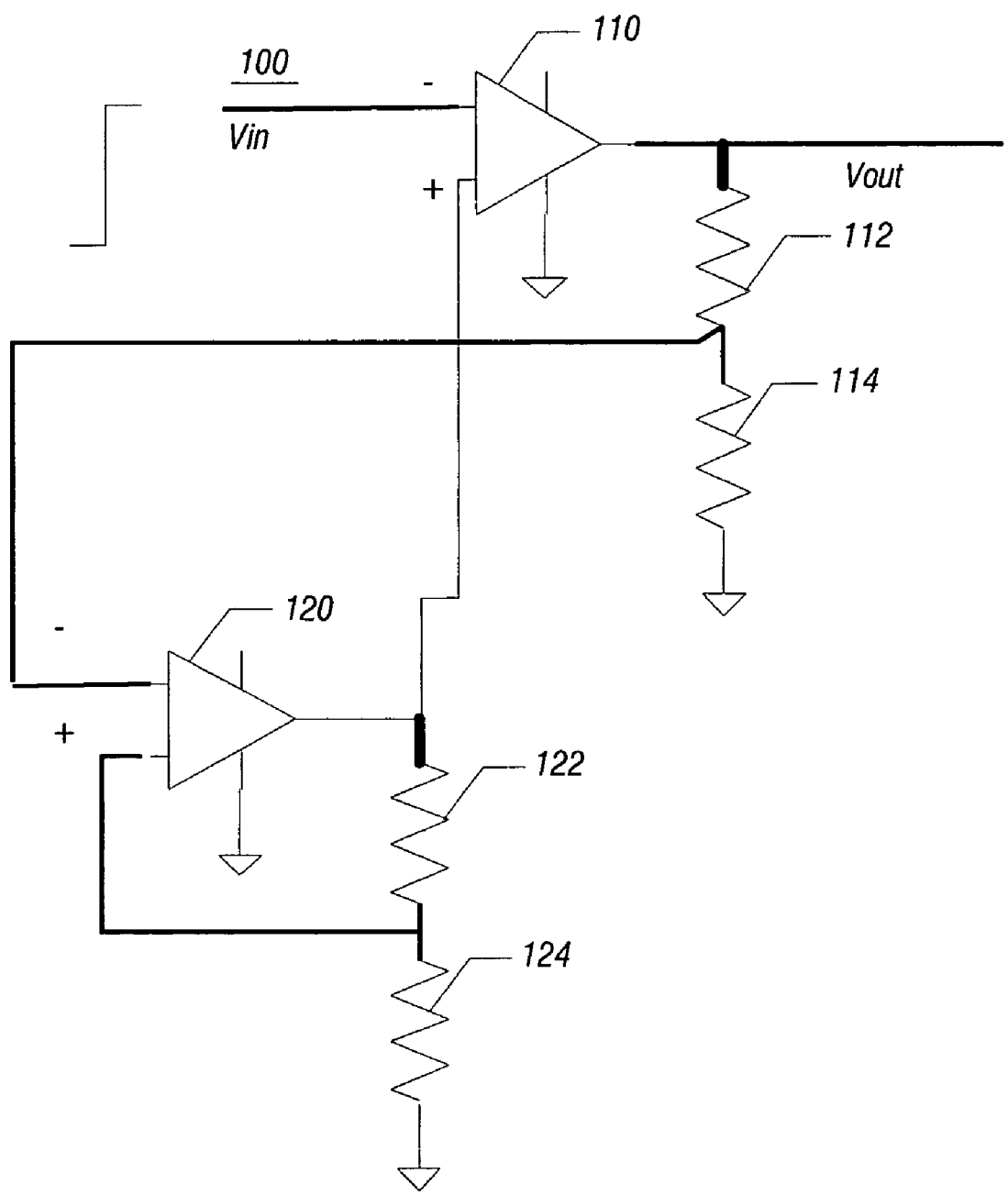
FIG. 3 is a schematic diagram of a hierarchical Schmitt trigger in accordance with one embodiment of the present invention.

Referring now to FIG. 3, shown is a schematic diagram of a hierarchical Schmitt trigger 100 in accordance with one embodiment of the present invention. As shown in FIG. 3, hierarchical Schmitt trigger 100 includes a first amplifier 110 and a second amplifier 120. The amplifiers may be differential amplifiers, in certain embodiments. First amplifier 110 has an inverting input coupled to receive an input voltage signal $V_{in}$ and a noninverting input coupled to receive an output of second amplifier 120. The output of amplifier 110 is the output signal of the circuit, $V_{out}$. Also, $V_{out}$ is coupled through a voltage divider formed of resistors 112 and 114 to the inverting input of amplifier 120. As discussed above, the output of amplifier 120 is fed to the noninverting input of amplifier 110. In addition, the output of amplifier 120 is fed back to the noninverting input of amplifier 120 through a voltage divider formed of resistors 122 and 124. In different embodiments, the values of resistors 112, 114, 122 and 124 may vary as desired.

Figure 4:
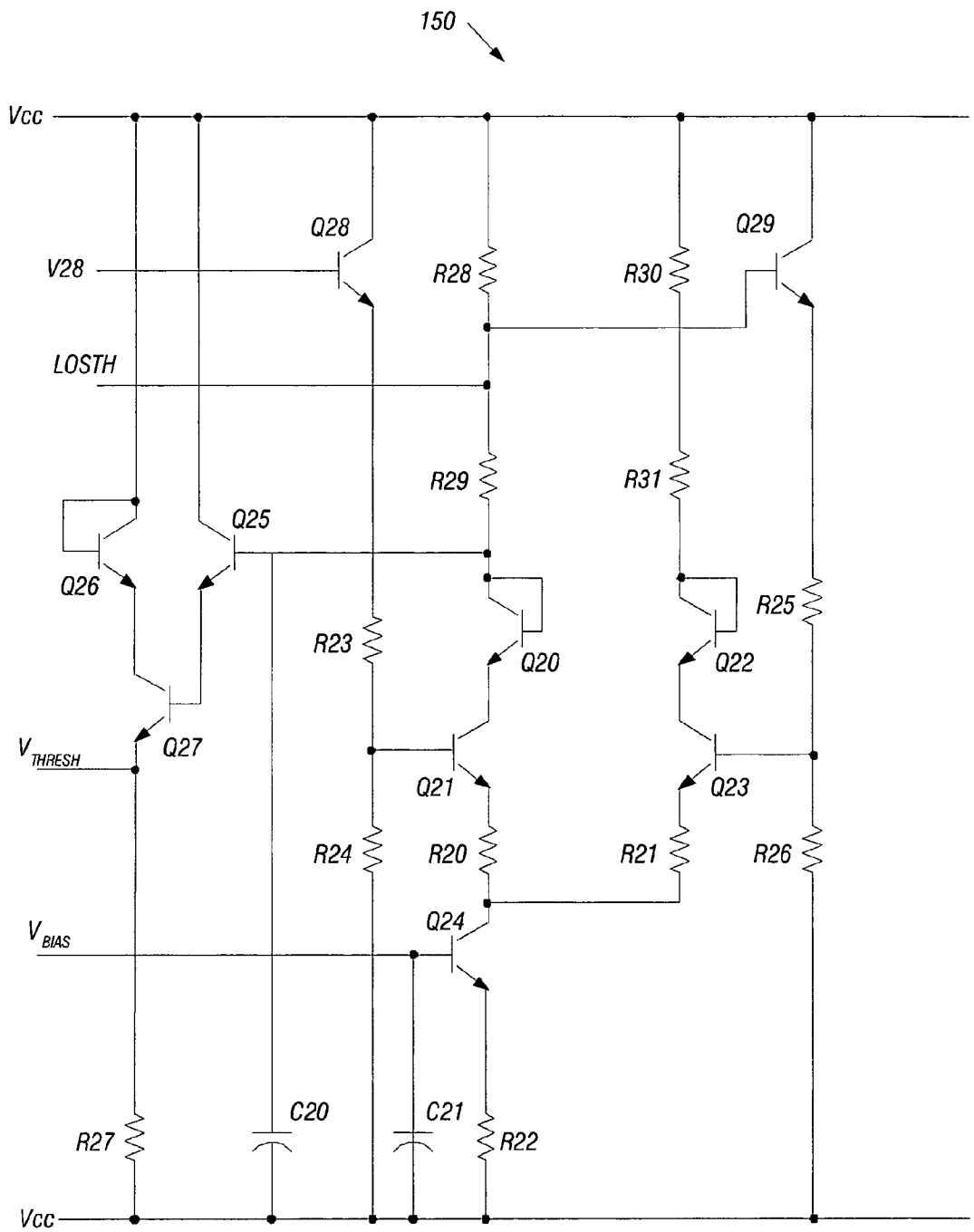
FIG. 4 is a detailed schematic diagram of the hierarchical Schmitt trigger of FIG. 3.

Referring now to FIG. 4, shown is a detailed schematic diagram of a hierarchical Schmitt trigger current 150 in accordance with one embodiment of the present invention. As shown in FIG. 4, the circuit is formed with a differential amplifier structure having one output feeding back into one input.

As shown in FIG. 4, a loss of signal threshold signal (LOSTH) is input to a node between resistors R28 and R29. The LOSTH signal may be received from an off chip variable resistor or potentionometer, in one embodiment. Resistor R29 is further coupled to a collector of transistor Q20 and a base of transistor Q25, which is part of a Darlington circuit. In the embodiment of FIG. 4 (as with the transistors of FIG. 2), the transistors may be InP hbt transistors of a minimum size. Transistor Q20 has its base coupled to its collector and an emitter coupled to a collector of transistor Q21. Transistor Q21 in turn has an emitter coupled through a resistor R20 to a collector of transistor Q24, and a base coupled to a node between resistors R23 and R24. Resistor R23 is further coupled to an emitter of transistor Q28 which is driven by a control signal $V_{28}$ coupled to its base. In one embodiment, the control signal may be coupled to a node between R2 and a collector of Q8 (of FIG. 2).

Transistor Q24 has an emitter coupled to $V_{CC}$ through resistor R22 and a base coupled to receive a bias voltage ($V_{bias}$) from a bias generator. A capacitor C21 is coupled to between the base of Q24 and $V_{CC}$ for biasing. Further, a capacitor C20 is coupled between the base of Q25 and $V_{CC}$. A second portion of the differential amplifier stack may be similarly coupled with transistors Q22 and Q23 coupled similarly as transistors Q20 and Q21, with a base of Q23 coupled to a node between resistors R25 and R26. Resistor R25 is further coupled to an emitter of transistor Q29, which has a base coupled to a node between resistors R28 and R29, and a collector coupled to Vcc.

Still referring to FIG. 4, a Darlington circuit is formed of transistors Q25, Q26 and Q27 to provide a tracking voltage reference signal ($V_{threshold}$) to a threshold detector circuit. Q27 has an emitter coupled to $V_{CC}$ through resistor R27.

In one embodiment, the tracking voltage reference signal may be provided to a base of transistor Q4 of FIG. 2. While discussed as being so coupled, it is to be understood that a hierarchical Schmitt trigger in accordance with embodiments of the present invention may find application outside of such a peak detector circuit. That is, such a hierarchical Schmitt trigger may be used in applications in which it is desirable to adjust a hysteresis value. In such manner, a circuit may be allowed to adjust a set threshold with hysteresis to keep an output as a set percentage of an input level. That is, as an input level increases, a set threshold may be accordingly increased to maintain a set percentage of the input level as the set threshold.

In other embodiments, an n-level hierarchy of Schmitt triggers may be formed. Such embodiments may be used in fiber optics applications where signal strength detection is desired, such as in transimpedace amplifiers, limiting amplifiers, clock and data recovery (CDR) circuits, and laser modulators and drivers. Other embodiments may be used in radio frequency (RF) radio communications applications where signal strength detection and measurement is desired.

Figure 5:
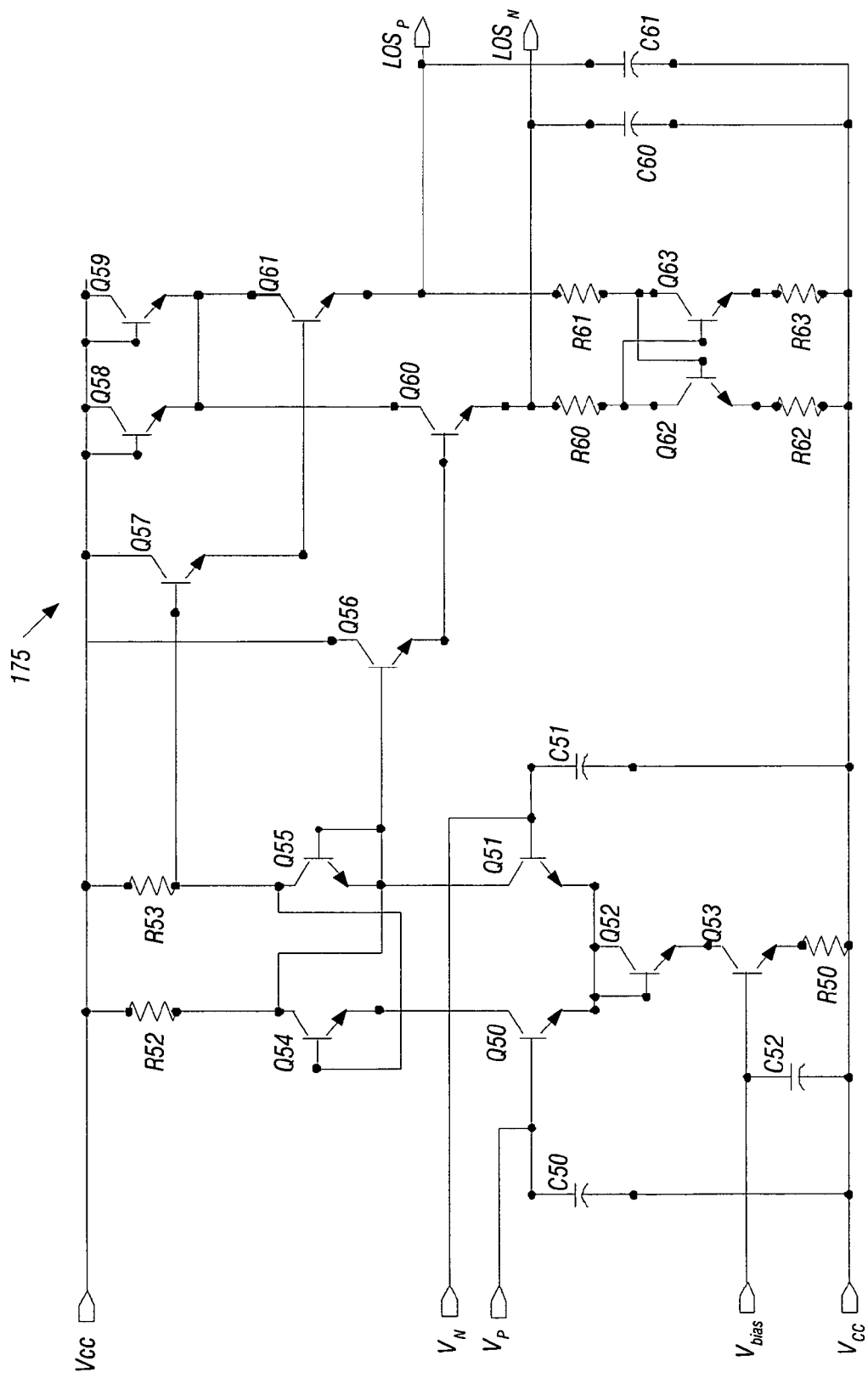
FIG. 5 is a detailed schematic diagram of an output buffer amplifier in accordance with one embodiment of the present invention.

FIG. 5 is a schematic diagram of an output buffer amplifier in accordance with one embodiment of the present invention. As shown in FIG. 5, output buffer amplifier 175 includes a differential amplifier stage formed of transistors Q50 and Q51, each having a base coupled to receive a respective input signal $V_N$ and $V_P$. Transistors Q50 and Q51 have emitters coupled together and further coupled to transistors Q52 and Q53 (connected in series to a voltage $V_{cc}$ through resistor R50). Transistor Q53 has a based coupled to receive a bias signal, $V_{bias}$. Additional biasing is obtained via capacitors C50, C51, and C52. Additionally, transistors Q50 and Q51 have collectors coupled to respective emitters of transistors Q54 and Q55, which have bases cross-coupled to the other's emitters. The collectors of Q54 and Q55 are further coupled to $V_{CC}$ through resistors R52 and R53.

The collectors of transistors Q54 and Q55 are further coupled to bases of transistors Q55 and Q56, which, together with a respective one of transistors Q60 and Q61 form a first and second Darlington circuit. The Darlington circuits provide one time level shifting to the differential outputs LOSP and LOSN.

In the embodiment shown in FIG. 5, the Darlington circuits are biased by transistors Q58 and Q59 having bases and collectors coupled to $V_{cc}$ and cross-coupled transistors Q62 and Q63 having emitters coupled to $V_{cc}$ through resistors R62 and R63. The output signals LOSP and LOSN are further biased by capacitors C60 and C61 and resistors R60 and R61.

In such manner, output buffer amplifier 175 provides extra gain beyond that which is available with resistive loads. Further, output buffer amplifier 175 provides boosted gain by using the cross-coupled transistors to provide positive feedback and a measure of hysteresis. In various embodiments, the gain provided by such an output stage may be greater than that provided via a resistive load and/or a cascaded output stage.

Figure 6:
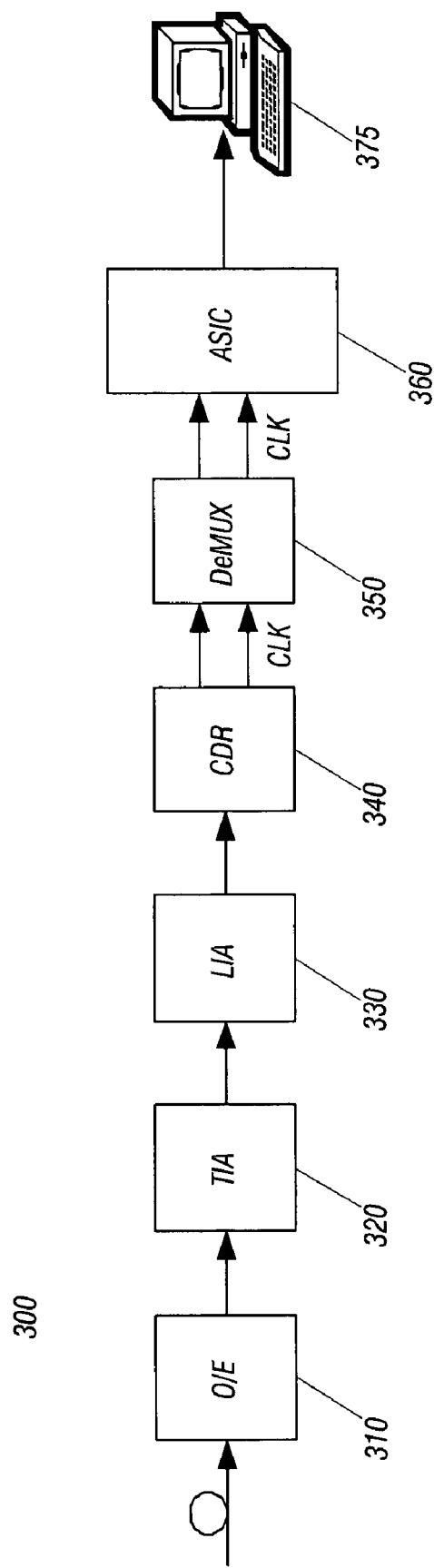
FIG. 6 is a block diagram of an optical system in accordance with one embodiment of the present invention.

Referring now to FIG. 6, shown is a block diagram of a system in accordance with one embodiment of the present invention. As shown in FIG. 6, system 300 may include a receiver line card or other switching device used in, for example, a high speed optical network, such as a metro area network (MAN), a local area network (LAN), or a wide area network (WAN).

As shown in FIG. 6, system 300 receives an optical signal from, for example, an optical fiber, and converts it into an electrical signal. An optical to electrical (O/E) converter 310 may be used to convert the optical input into a small electrical current. In various embodiments, O/E converter 310 may be a positive intrinsic negative (PIN) diode or an avalanche photo detector (APD). A transimpedance amplifier (TIA) 320 (or pre-amplifier) then converts the current into an electrical voltage. The TIA signal, which may vary from a few mV up to 150 mV (peak to peak) or more, may be passed to a limiting amplifier (LIA) 330. In alternate embodiments, an automatic gain controlled (AGC) amplifier may be used in place of the LIA. LIA 330 produces a signal of sufficient amplitude/power to drive a clock and data recovery (CDR) device 340. CDR 340 may convert the analog input signal to a digital bit stream with an associated clock (CLK). A demultiplexer (DeMUX) 350 may be used to convert the serial high-speed data stream to a parallel signal at lower speed. In one embodiment, DeMUX 350 may transform the serial data signal into four parallel data signals at a corresponding lower data rate. If, for example, in an optical carrier (OC)—768 system transmitting data at 40 Gigabits per second (Gbit/s), data is fed into a 1:4 DeMUX, four parallel data outputs at 10 Gbit/s may be produced.

These data signals may interface to a digital processing system, for example, via an application specific integrated circuit (ASIC) 360. ASIC 360 may be a media access control (MAC) module, for example. In one embodiment, the line card may serve as an interface between an optical fiber line and a computer system 375. It is to be understood that a given line card may also include components to transmit signals over an optical fiber. Such components may include a laser driver, an encoder and a serializer, for example, for the transmitting mode.

While discussed above as an optical system, it is to be understood that embodiments of the present invention may be used in connection with various optical, radio and other devices which may benefit from loss of signal detection and hysteresis adaption in accordance with an embodiment of the present invention.

Embodiments may be implemented in a computer program that may be stored on a storage medium having instructions to program a system to perform the embodiments. The storage medium may include, but is not limited to, any type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic RAMs and static RAMs, erasable programmable read-only memories (EPROMs), electrically erasable programmable read-only memories (EEPROMs), flash memories, magnetic or optical cards, or any type of media suitable for storing electronic instructions.

Thus in certain embodiments, peak detection, voltage comparison and latching may be merged into one compact circuit stage. Further, an absolute value rectifier, peak detector may be accomplished using two transistors. In various embodiments, the peak detector may be self-latching, and provide for low input loading such that bandwidth of a limiting amplifier to which it is coupled is not affected. More so, a high frequency of operation, (in excess of 40 GHz) may be provided with high sensitivity having a positive feedback that boosts gain. Operation over a high dynamic range may be accommodated, as a low number of devices between supply increases region of operation, along with a common mode feedback bias circuit that maintains device operation in the forward active region. In such a manner, excellent process, temperature, and supply tracking through biasing and a reference scheme may be accomplished, in certain embodiments.

In certain embodiments, a hysteresis ratio of 2 dB to 6 dB may be maintained over a 10:1 threshold dynamic range of 15 mV to 150 mV. However, in other embodiments, a greater threshold dynamic range may be effected.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   a threshold detector having a first current comparator to determine if an input signal exceeds a threshold, the threshold detector including an absolute value detector coupled to receive the input signal from an amplifier stage;
   a second current comparator coupled to receive an output of the first current comparator;
   a current source to provide a source current to the absolute value detector;
   a reference circuit to generate a tracking reference signal; and
   a feedback circuit to generate a feedback signal to control the current source, the feedback signal based upon the tracking reference signal and the output of the absolute value detector.

2. The apparatus of claim 1, wherein the second current comparator is to generate a high gain signal.

3. The apparatus of claim 1, wherein the first current comparator comprises a cascode current comparator and the second current comparator comprises a differential current comparator.

4. A method comprising:
   determining an absolute value of a differential input;
   comparing the absolute value to a reference signal using a current comparator; and
   providing a direct current feedback signal based on the absolute value and the reference signal to a current source.

5. The method of claim 4, further comprising providing an output of the current comparator that is indicative of a loss of received signal of an optical communication system.

6. The method of claim 4, further comprising receiving the differential input from a limiting amplifier.

7. The method of claim 4, further comprising generating a differential signal based on comparing the absolute value to the reference signal.

8. The method of claim 7, further comprising generating a high gain differential signal from the differential signal.

9. The method of claim 4, further comprising controlling the current source to provide a source current for an absolute value detector and a reference signal generator based on the direct current feedback signal.

10. The method of claim 4, further comprising using a cascode current comparator to compare the absolute value to the reference signal.

11. The method of claim 4, further comprising generating the reference signal compensated for temperature variation.

12. An apparatus comprising:
    an absolute value detector to receive a differential input;
    a cascode current comparator coupled to an output of the absolute value detector;
    a latch coupled to the cascode current comparator; and
    a differential current comparator coupled between the cascode current comparator and the latch.

13. The apparatus of claim 12, further comprising a current source to provide a source current to the absolute value detector.

14. The apparatus of claim 13, further comprising a reference circuit coupled to receive the source current and provide a tracking reference signal to the cascode current comparator.

15. The apparatus of claim 12, further comprising a plurality of buffers coupled to the latch to generate a differential output representative of a loss of received signal of the differential input.

16. The apparatus of claim 15, wherein the plurality of buffers each comprises a Darlington circuit.

17. The apparatus of claim 14, wherein the reference circuit comprises a plurality of Schmitt triggers.

18. The apparatus of claim 17, wherein the plurality of Schmitt triggers comprise a first Schmitt trigger having an output coupled to an input of a second Schmitt trigger.

19. An apparatus comprising:
    an absolute value detector to receive a differential input;
    a cascode current comparator coupled to an output of the absolute value detector;
    a current source to provide a source current to the absolute value detector;
    a reference circuit coupled to receive the source current and provide a tracking reference signal to the cascode current comparator;
    a feedback circuit coupled to receive the output of the absolute value detector and the tracking reference signal and to generate a feedback signal to be provided to the current source; and
    a latch coupled to the cascode current comparator.

20. The apparatus of claim 19, further comprising a differential current comparator coupled between the cascode current comparator and the latch.

21. The apparatus of claim 19, further comprising a plurality of buffers coupled to the latch to generate a differential output representative of a loss of received signal of the differential input.

22. The apparatus of claim 19, wherein the reference circuit comprises a plurality of Schmitt triggers.

23. A system comprising:
an absolute value detector to receive an input signal;
a first current comparator coupled to receive an output of the absolute value detector, the first comparator to also receive a reference signal; and
a feedback circuit to receive the output of the absolute value detector and the reference signal and to generate a reference signal for a current source for the absolute value detector.

24. The system of claim 23, further comprising a second current comparator to receive a differential output of the first current comparator.

25. The system of claim 24, wherein the first current comparator comprises a cascode current comparator and the second current comparator comprises a differential current comparator.

* * * * *